(12) United States Patent
Ciavatti

(10) Patent No.: US 6,544,841 B1
(45) Date of Patent: Apr. 8, 2003

(54) CAPACITOR INTEGRATION

(75) Inventor: Jérôme Ciavatti, Scottsdale, AZ (US)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/502,761

(22) Filed: Feb. 11, 2000

(30) Foreign Application Priority Data

Feb. 12, 1999 (FR) .............................................. 99 01892

(51) Int. Cl.[7] ..................... H01L 21/8242; H01L 21/20; H01L 29/76; H01L 27/108
(52) U.S. Cl. ....................... 438/254; 438/397; 257/308; 257/309
(58) Field of Search ................................. 438/253, 257, 438/396, 398, 240, 482, 605, 665; 257/296, 309, 316, 331, 365

(56) References Cited

U.S. PATENT DOCUMENTS

| | | | |
|---|---|---|---|
| 5,192,703 A | 3/1993 | Lee et al. ...................... | 437/52 |
| 5,338,700 A * | 8/1994 | Dennison et al. ............. | 437/60 |
| 5,340,765 A | 8/1994 | Dennison et al. ............. | 437/52 |
| 5,597,756 A | 1/1997 | Fazan et al. ................... | 437/52 |
| 5,702,989 A | 12/1997 | Wang et al. ................. | 438/397 |
| 5,939,747 A | 8/1999 | Yajima ........................ | 257/309 |
| 6,258,691 B1 * | 7/2001 | Kim ............................ | 438/389 |

OTHER PUBLICATIONS

French Search Report from corresponding European Patent Application 00 41 0010, filed Feb. 12, 1999.
Patent Abstracts of Japan, vol. 017, No. 657 (E–1470), Dec. 6, 1993 & JP 05 218343, Aug. 27, 1993.
Patent Abstracts of Japan, vol. 1998, No. 10. Aug. 31, 1998 & JP 10 144882 May 29, 1999.
French Search Report from French Patent Application 99/01892, filed Feb. 12, 1999.

* cited by examiner

*Primary Examiner*—Matthew Smith
*Assistant Examiner*—Calvin Lee
(74) *Attorney, Agent, or Firm*—Wolf, Greenfield & Sacks, P.C.; James H. Morris

(57) ABSTRACT

A capacitor having an electrode with a general cup shape, including a generally horizontal bottom and vertical walls, and in electric contact by its bottom with a conductive pad, the pad extending beyond the upper surface of an insulating layer and the bottom including a complementary recess of the protruding pad portion.

9 Claims, 1 Drawing Sheet

CAPACITOR INTEGRATION

BACKGROUND OF THE INVENTION

1. Field of the Invention

The present invention generally relates to forming a capacitor in an integrated circuit. Such capacitors form, for example, the storage element of a DRAM cell.

2. Discussion of the Related Art

FIGS. 1A and 1B schematically illustrate, in cross-section and top view, respectively, a portion of a DRAM cell structure at an intermediary stage of its formation in an integrated circuit according to a conventional manufacturing method. Each DRAM cell includes a MOS control transistor and a capacitor having an electrode in contact with a region of substrate 1, typically a source/drain region of the control transistor. It is here assumed that the MOS transistors (not shown) have already been formed in a semiconductor substrate 1. It should be noted that "substrate" designates a uniformly doped silicon wafer as well as epitaxial layers and/or layers specifically doped by diffusion/implantation formed on or in a massive substrate. Such wafers or regions may further have been previously silicided, at least partially.

An insulating layer 2, typically made of silicon oxide, is formed on substrate 1. Layer 2 is provided with first openings typically square-shaped in top view.

Each of these openings is filled with a conductive pad 3, typically made of tungsten or polysilicon. Pads 3 are in contact with source/drain regions (not shown) of the control transistors.

The structure is coated with an insulating layer 4, typically silicon oxide. In layer 4 are formed second openings to expose the upper surface of pads 3. The second openings typically have a rectangular shape in top view.

A second conductive layer 5 is formed on the walls and bottoms of the second openings. This layer 5 results, for example, from a conformal polysilicon deposition followed by a chem-mech etching of the portion of polysilicon deposition covering the upper surface of layer 4.

A first electrode 5 of a capacitor in electric contact with an underlying substrate 1 via a conductive pad 3 has thus been formed. Electrode 5 has a flat-bottom cup shape. Indeed, the electrode has in cross-section (FIG. 1A) vertical walls and a horizontal bottom, and has in top view (FIG. 1B) substantially the shape of a rectangle. At this stage of the manufacturing, as illustrated in FIG. 1A, the inside of the cup formed by electrode 5 is empty. As illustrated in FIGS. 1A and 1B, the horizontal bottom of electrode 5 is in contact substantially by its middle with the top of pad 3.

The structure thus obtained and shown in FIGS. 1A and 1B is then completed by the conformal deposition of an insulator (not shown), followed by the deposition and etching of a conductive layer (not shown) forming a second electrode that may be common to several capacitors.

To improve the performance of integrated memories, the electronic industry now requires increasing the capacitance of the capacitors forming the storage nodes of DRAM cells without reducing the memory density or increasing the memory density without reducing the capacitor capacitance.

SUMMARY OF THE INVENTION

An object of the present invention is to provide a novel integrated capacitor structure having a greater capacitance.

Another object of the present invention is to provide such a structure in which the contact between the conductive pad and the first electrode is improved.

To achieve these and other objects, the present invention provides a capacitor having an electrode with a general cup shape, including a generally horizontal bottom and vertical walls, and in electric contact by its bottom with a conductive pad, the pad extending beyond the upper surface of an insulating layer and the bottom including a recess complementary to the protruding pad portion.

According to an embodiment of the present invention, the electrode is made of polysilicon.

According to an embodiment of the present invention, the pad is made of tungsten.

According to an embodiment of the present invention, the pad is made of polysilicon.

According to an embodiment of the present invention, the insulating layer is made of silicon oxide.

According to an embodiment of the present invention, said electrode is formed of two distinct elements each being substantially cup-shaped, and each being in electric contact with a portion of the pad.

The present invention also provides a method of manufacturing a capacitor, including the steps of:

Forming, in a first insulating layer, a first opening to expose a chosen region of a semiconductor substrate;

depositing and etching a first conductive layer to form a conductive pad in the first opening;

depositing a second insulating layer;

forming, in the second insulating layer and the first insulating layer, a second opening, so that the pad protrudes from the first insulating layer;

conformally depositing a second conductive layer;

etching the second conductive layer to remove its horizontal portions resting on the second insulating layer;

conformally depositing a thin dielectric; and depositing and etching a fourth conductive layer.

According to an embodiment of the present invention, the first and second conductive layers are made of silicon oxide.

According to an embodiment of the present invention, the etching of the second conductive layer is a chem-mech etching.

The present invention also provides a method of manufacturing a capacitor, including the steps of:

forming, in a first insulating layer a first opening to expose a chosen region of a semiconductor substrate;

depositing and etching a first conductive layer to form a conductive pad in the first opening;

depositing a second insulating layer;

forming, in the second insulating layer and the first insulating layer, second adjacent openings separated by an insulating strip narrower than the pad and substantially centered on the pad;

conformally depositing a second conductive layer;

etching the second conductive layer to remove its horizontal portions resting on the second insulating layer;

conformally depositing a thin dielectric; and depositing and etching a fourth conductive layer.

According to an embodiment of the present invention, the first openings have in top view dimensions of 0.3×0.23 $\mu$m and the second openings have dimensions of 0.3×0.5 $\mu$m.

The foregoing objects, features and advantages of the present invention will be discussed in detail in the following non-limiting description of specific embodiments in connection with the accompanying drawings.

DETAILED DESCRIPTION

For clarity, the same elements have been referred to with the same references in the different drawings and, further, as usual in the representation of integrated circuits, the different cross-section views are not drawn to scale.

Figure 1A:
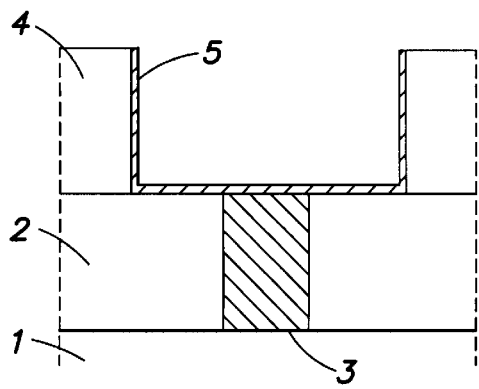
FIGS. 1A and 1B illustrate a conventional integrated capacitor structure.
Figure 1B:
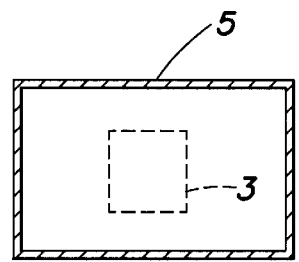
Figure 2A:
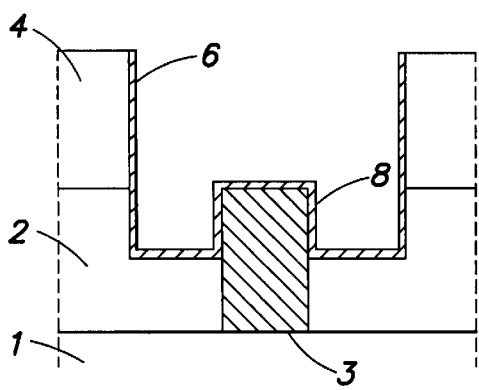
FIGS. 2A and 2B illustrate a novel integrated capacitor structure.
Figure 2B:
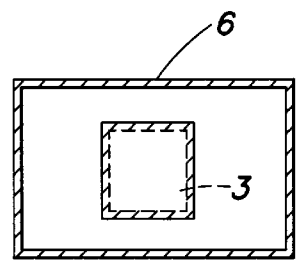

FIGS. 2A and 2B schematically illustrate, in cross-section and top view, respectively, a portion of a DRAM cell structure formed in an integrated circuit according to a novel manufacturing process. More specifically, FIGS. 2A and 2B show such a novel structure at an intermediary stage of its manufacturing similar to that of the conventional structure previously described in relation with FIGS. 1A and 1B. Each DRAM cell includes a MOS control transistor and a capacitor, an electrode of which is in contact with a region of substrate 1, for example, a source/drain region of the control transistor. It is again assumed that MOS transistors (not shown) have already been formed in semiconductor substrate 1.

The method starts with steps similar to those of a conventional process: forming first openings in a first insulating layer 2, to expose chosen regions of substrate 1, for example, source/drain regions (not shown) of the control transistors; depositing and etching a first conductive layer to form in the first openings conductive pads 3; and depositing a second insulating layer 4.

In an embodiment, layer 2 is made of silicon oxide and has a 600-nm thickness, the first openings being, for example, in top view, squares of a 0.2-$\mu$m side. Pads 3 are filled with tungsten or polysilicon. Layer 4 is made of silicon oxide and has a 600-nm thickness.

According to the present invention, second openings are formed in second insulating layer 4 and in first insulating layer 2 to expose the upper surface and a portion of the vertical walls of pads 3.

A feature of the present invention is the forming of such second openings deeper than conventional second openings, having pads 3 protrude with respect to an unetched portion of first insulating layer 2.

For this purpose, the same etch mask as in a conventional method is used. The second openings then have, in top view, a conventional rectangular shape. Such a rectangle will, for example, have 0.8×0.5-$\mu$m dimensions.

As previously noted, layers 2 and 4 are made of the same insulating material, preferably silicon oxide. To etch layer 2 after layer 4, it is enough to increase the etching time.

In an embodiment (not shown), the interface between layers 2 and 4 is formed of a thin layer made of an insulating material selectively etchable with respect to the first insulating material and with respect to the material forming pad 3, for example, silicon nitride. Then, layer 4 and the interface layer are removed before appropriately etching layer 2.

In an embodiment (not shown), the structure of layer 2 may be modified to efficiently control the stopping of its etching. For example, layer 2 may be a triple layer formed of a lower portion (in contact with substrate 1) and an upper portion made of a first insulating material, separated by a thin layer made of a second insulating material. The first insulating material will preferably be silicon oxide. The second insulating material will be selectively etchable with respect to the first insulating material and with respect to the material forming pad 3. It may be, for example, silicon nitride. Thus, the second openings will be formed in layer 2 to expose this last thin silicon nitride layer around pads 3.

A second conductive layer 6 is formed on the walls and the bottom of each opening. Layer 6 results, for example, from a conformal deposition of polysilicon followed by a chem-mech etching of the portion of the polysilicon deposition covering the upper surface of layer 4.

A first capacitor electrode 6 in electric contact with an underlying substrate 1 via a conductive pad 3 protruding from an insulating layer has thus been formed. As previously, electrode 6 is substantially cup-shaped. It however has two main differences with the prior structure. On the one hand, the cup walls are higher than in the case of FIG. 1A. On the other hand, the cup bottom has a recess 8 that follows the contour of a portion of pad 3 protruding from insulating layer 2.

The structure thus obtained and shown in FIGS. 2A and 2B is then completed by the conformal deposition of an insulator (not shown), followed by the deposition and the etching of a new conductive layer (not shown) forming a second electrode possibly common to several capacitors.

An advantage of the present invention is that it increases the capacitance of integrated capacitors. As appears from a comparison of FIGS. 1A and 2A, on the one hand, and 1B and 2B, on the other hand, the surface of electrode 6 is greater than that of a conventional electrode 5 due to the height increase of the cup edges and due to the presence of recess 8. More specifically, this surface is increased by the vertical portions formed in layer 2. Assuming that the dimensions in top view of electrode 6 are substantially 500×350 nm and assuming that layer 2 has been etched over a height of substantially 300 nm, the surface of electrode 6 will be on the order of 3.1 $\mu m^2$ instead of 1.96 $\mu m^2$ for a conventional electrode (5, FIGS. 1A and 1B).

Another advantage of the present invention is that this capacitance increase of DRAM cell capacitors is done with no mask modification. As appears from the foregoing description and from a comparison of FIGS. 1B and 2B, the mask used to form the second openings in which are formed the first capacitor electrodes remains unchanged with respect to a conventional method.

Another advantage of the present invention is to improve the contact between each capacitor electrode 6 and the underlying semiconductive region. Indeed, according to the present invention, the contact between an electrode 6 and the corresponding pad 3 is improved by the fact that this contact corresponds not only to the upper pad surface, but also to an upper crown of the pad.

Figure 3A:
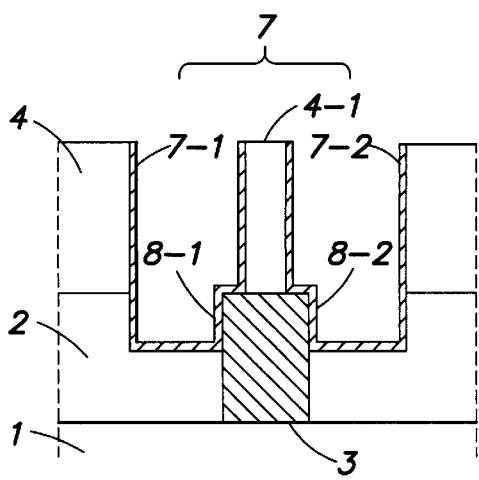
FIGS. 3A and 3B illustrate an alternative of the structure shown in FIGS. 2A and 2B.
Figure 3B:
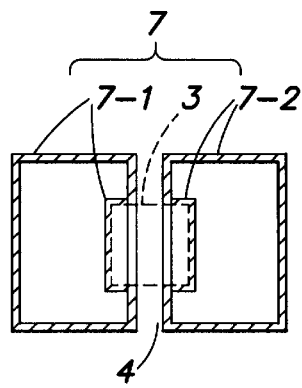

FIGS. 3A and 3B illustrate an alternative of the structure previously described in relation with FIGS. 2A and 2B.

According to this alternative, the second openings are formed as described hereabove in relation with FIGS. 2A and 2B, in first insulating layer 4 and in first insulating layer 2, to leave in place at the level of each pad 3 a portion 4-1 of this layer 4 separating two independent openings, each exposing a portion of the top of pad 3 on either side of the portion of layer 4 left in place. Portion 4-1 is left in place substantially at the center of pad 3, to symmetrically expose separate portions of its upper surface.

A second conductive layer 7 is formed on the walls and the bottom of each opening. Layer 7 results, for example, from a conformal deposition of polysilicon followed by a chem-mech etching of the portion of the polysilicon deposition covering the upper surface of layer 4.

A first capacitor electrode 7 in electric contact with an underlying substrate 1, formed of two independent half-electrodes 7-1 and 7-2, has thus been formed. As previously, each of half-electrodes 7-1 and 7-2 is substantially cup-shaped. The bottom of each half-electrode 7-1, 7-2 has thus, in cross-section view (FIG. 3A), a recess 8-1, 8-2 that follows the contour of a portion of pad 3 protruding from insulating layer 2. Each of half-electrodes 7-1 and 7-2 has, in top view (FIG. 3B), substantially the shape of a rectangle.

It should be noted that the surface of each of half-electrodes 7-1 and 7-2 is greater than half the surface of a conventional electrode such as illustrated in FIGS. 1A and 1B, due to their additional vertical wall above pad 3.

The structure thus obtained and shown in FIGS. 3A and 3B is then completed by the conformal deposition of an insulator (not shown), followed by the deposition and the etching of a new conductive layer (not shown) forming a second electrode possibly common to several capacitors.

An advantage of this alternative is to further increase the integrated capacitor capacitance. As appears from a comparison of FIGS. 1A or 2A and 3A, on the one hand, and 1B or 2B and 3B, on the other hand, the surface of electrode 7 is increased due to the connection in parallel of two half-electrodes 7-1, 7-2, each having a surface greater than half the surface of a conventional electrode. Assuming the capacitance of a conventional capacitor with a first single cup electrode 5 such as shown in FIGS. 1A and 1B to be one, assuming that the dimensions in top view of each of half-electrodes 7-1, 7-2 are substantially 500×350 nm and that the width of the portion of layer 4 maintained above pad 3 to separate half-electrodes 7-1, 7-2 is on the order of 150 nm, and assuming that layer 2 has been etched over a height of substantially 300 nm, the surface of double deep cup electrode 7 according to this alternative will be on the order of 3.4 $\mu m^2$.

Of course, the present invention is likely to have various alterations, modifications, and improvements which will readily occur to those skilled in the art. In particular, the depth of the second openings in first insulating layer 2 may be easily modified by controlling by conventional techniques the etching of layer 2 (etch time and/or forming of a silicon nitride etch stop layer). Further, after etching first electrode 6 and before conformally depositing the insulator (not shown) intended for forming the capacitor dielectric, a second insulating layer 4 may be at least partially removed to further increase the electrode surface and thus the capacitance, outside of the cup, along the vertical walls. Further, the present invention also applies to the capacitance increase of any type of integrated capacitors other than DRAM cell storage elements.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of manufacturing a capacitor, including the steps of:
   forming, in a first insulating layer, a first opening to expose a chosen region of a semiconductor substrate;
   depositing and etching a first conductive layer to form a conductive pad in the first opening;
   depositing a second insulating layer;
   forming, in the second insulating layer and the first insulating layer, second adjacent openings separated by an insulating strip narrower than the pad and substantially centered on the pad;
   conformally depositing a second conductive layer;
   etching the second conductive layer to remove its horizontal portions resting on the second insulating layer;
   conformally depositing a thin dielectric; and
   depositing and etching a fourth conductive layer.

2. The method of claim 1, wherein the first openings have in top view dimensions of 0.3×0.23 $\mu$m and the second openings have dimensions of 0.3×0.5 $\mu$m.

3. The method of claim 1, wherein the first and second conductive layers are made of silicon oxide.

4. The method of claim 1, wherein the etching of the second conductive layer is a chem-mech etching.

5. A capacitor, comprising:
   a conductive pad including a contact portion with lateral sides and a top surface;
   an electrode having lateral walls and a bottom surface, the bottom surface including a lateral contact region in electrical contact with the lateral sides of the contact portion and a horizontal contact region in contact with the top surface of the contact portion,
   wherein the lateral contact region adds surface area to the electrode; and
   further having an insulative wall formed on the top surface of the contact portion such that a region of the electrode disposed on sides of the insulative wall further adds surface area to the electrode.

6. The capacitor according to claim 5, wherein the insulative wall has a width less than a width of the top surface of the contact portion and the horizontal contact region of the electrode is in contact with at least part of the top surface of the contact portion of the conductive pad.

7. The capacitor according to claim 5, wherein the insulative wall extends from the top surface of the contact portion of the pad to substantially the same level as the lateral walls of the electrode.

8. A storage element of a DRAM cell, the storage element, comprising:
   a storage area formed in at least one insulating layer, the storage area having lateral walls and a bottom surface;
   a conductive pad extending from a semiconductor substrate to beyond the bottom surface of the storage area, such that the pad has a protruding portion having lateral sides and a top surface within the storage area;
   a conductive layer disposed over the lateral walls and bottom surface of the storage area and the protruding portion of the pad, the conductive layer forming an electrode of a capacitor of the storage element,
   wherein portions of the conductive layer over the bottom surface of the storage area, and portions of the conductive layer over the top surface of the pad are in substantially different horizontal planes.

9. The storage element according to claim 8, wherein a vertical distance between the horizontal planes is substantially the same as a height of the lateral sides of the protruding portion.

* * * * *